United States Patent [19]

Garbe et al.

[11] Patent Number: 4,845,378
[45] Date of Patent: Jul. 4, 1989

[54] EMP GENERATOR

[75] Inventors: Heyno Garbe, Baden; Diethard Hansen, Berikon; Dietrich Königstein, Gebenstorf, all of Switzerland

[73] Assignee: BBC Brown Boveri AG, Baden, Switzerland

[21] Appl. No.: 162,265

[22] Filed: Feb. 29, 1988

[30] Foreign Application Priority Data

Mar. 2, 1987 [CH] Switzerland .......................... 774/87

[51] Int. Cl.$^4$ ............................................. H01H 33/66
[52] U.S. Cl. .................................... 307/106; 307/112; 200/144 B; 200/148 E; 200/148 BV; 361/116
[58] Field of Search ............... 307/106, 107, 108, 109, 307/112; 200/82 B, 83 C, 144 R, 144 A, 144 BA, 144 AP, 144 C, 148 R, 148 BV, 148 C, 148 D, 148 E, 148 F, 148 G, 150 A, 150 B, 150 C, 150 D, 150 E, 150 F, 150 G, 150 H, 150 IA, 150 J, 150 L, 150 M, 151, 149B; 361/123, 144, 125, 126, 127, 128, 129, 130, 131, 132, 134, 135, 124, 119, 120

[56] References Cited

U.S. PATENT DOCUMENTS

| | | | |
|---|---|---|---|
| 2,814,687 | 11/1957 | Forwald | 200/82 B |
| 3,522,400 | 7/1970 | Golota | 200/148 BV |
| 3,555,354 | 1/1971 | Kotos | 361/116 X |
| 3,588,520 | 6/1971 | Barkan | 307/112 |
| 3,701,867 | 10/1972 | Henry et al. | 200/148 E |
| 4,618,749 | 10/1986 | Bohme et al. | 200/144 BA |

Primary Examiner—William M. Shoop, Jr.
Assistant Examiner—Paul Ip
Attorney, Agent, or Firm—Oblon, Spivak, McClelland, Maier & Neustadt

[57] ABSTRACT

The present invention relates to a generator concept by means of which, in particular, the effects of so-called nuclear electromagnetic pulses on electrical or electronic devices can be simulated by applying the so-called current injection technique. In the context of the generator concept according to the invention, in particular, a pneumatically controllable very fast spark gap is disclosed. Furthermore, a generator circuit having two spark gaps (40, 41) is disclosed which is capable of generating a voltage pulse having an amplitude which is four times as large as the voltage of its voltage supply. With the exception of the spark gaps, the components 42-49) of the generator circuit only need to be designed for the above voltage of the voltage supply with respect to their continuous loading. The generator circuit according to the invention, in particular in conjunction with the spark gap according to the invention, allows a very fast efficient pulse generator to be constructed.

9 Claims, 3 Drawing Sheets

EMP GENERATOR

BACKGROUND OF THE INVENTION

1. Field of the Invention

The present invention relates to an EMP generator. In particular, it relates to such a generator having at least one spark gap with two approximately spherical poles. It furthermore particularly relates to such a generator having at least two spark gaps connected in series with several capacitors and a power supply connected to the said series circuit via several resistors. The abbreviation EMP stands for "electro-magnetic pulse". The EMP generator is intended to be used for EMP simulation by means of current injection.

2. Discussion of Background

Standards committees, governmental authorities responsible for EMP and, above all, industry as equipment and plant suppliers are increasingly occupied with the search for realistic cost-effective EMP simulation methods.

In EMP simulation, it is a matter of investigating the effects of electro-magnetic interference fields, particularly of the so-called NEMP, on electrical or electronic systems, of taking suitable protective measures and checking these measures for their effectiveness. The NEMP is an electromagnetic pulse with a rise time of a few nanoseconds, a half-value period of decay of approximately 200 nanoseconds and a field strength of approximately 50 kV/m, to be expected when an atomic bomb is exploded outside the earth's atmosphere.

It is frequently too expensive and often not even possible, mainly in the case of relatively large equipment and particularly in the case of major installations, to expose the systems to be investigated directly to a field radiation.

The current injection technique previously mentioned offers an alternative here because the currents caused by the fields in the systems are, after all, the cause for their disturbance or destruction.

In the current injection technique, the system to be investigated is directly loaded with a current generated by a generator. Alternatively, a voltage possibly resulting in a current flow is applied to the system. As a rule, the systems to be investigated are electrical or electronic devices which are already provided with shielding. In these cases, the current is simply fed in via one of the plug-in connections present in most cases on the shielding housing. A standard regulation of US Navy MIL STD 461C prescribes for this type of test a generator which generates a current or voltage pulse of 10A or 1 kV, respectively, which oscillates at a frequency between 10 kHz and 100 MHz, across a resistive load. The standard is intended to ensure that the system test occurs under conditions as are expected in the case of an NEMP.

In fact, measurements in EMP field simulators have produced current or voltage shapes and intensities of the above type in electrical or electronic systems when irradiated with a pulse corresponding to the NEMP. However, the standardized test method exhibits grave disadvantages and not inconsiderable risks.

The main problem consists in the fact that the generators to be used in accordance with the standard generate the prescribed pulse only across a 100 kΩ resistance but that quite different pulse rates can be produced in connection with the system to be tested being the load. An adaptation of the generator to the respective load, that is to say to the respective characteristics of the system to be tested in each case is not provided for.

Neither are generators known in which such adaptation could be easily carried out. However, such an adaptation is absolutely necessary to obtain a test and investigation result which is meaningful even to some extent.

Another problem arises from injecting the test pulse directly into the system. In the case of shielded systems, electromagnetic fields primarily always cause currents to flow on the surface of the shielding. The voltages and currents occurring within the shielding are only the secondary consequence of these surface currents and are caused by coupling-in. The magnitude and the type of couplings depends on many factors. The typical shield attenuation is about 40 dB. As a rule, the pulses are not transferred with the same shape. The currents and voltages occurring inside the shielding therefore exhibit a variation which differs from the currents on the shieldings.

However, the effect of the currents and voltages coupled in on the system significantly depends on their variation with time. Thus, for example, the occurrence of flashovers or the responding of protective elements such as, for example, spark gaps, is affected by the steepness of the pulses. Naturally, the question whether and when a flash-over occurs or a protective element responds are decisive criteria for the behavior of a system under interference loading. By injecting the current or voltage pulse directly into the interior of the system to be investigated, all the effects occurring with the coupling-in from its shielding are neglected by the measuring technique.

In addition to an adaptation of the generator and the current or voltage pulses generated by it to the system to be investigated in each case, they should therefore not be applied in the interior of the system but on its shielding. A further important reason for this is that the surface currents occurring due to the electromagnetic interference fields on the shieldings can still be relatively well predicted by computation but their coupling-in behavior into the system cannot.

Naturally, applying the current or voltage pulses to the shielding has the consequence that current intensities or voltages which are higher by the magnitude of attenuation of approximately 40 dB must be generated and supplied by the generator.

Known generators which, in principle, meet the aforementioned requirements, are very large, unwieldy, virtually untransportable and expensive devices.

Another problem in the case of the known generators is that they supply either a current pulse or a voltage pulse. In the case of interference being coupled-in into a system, however, voltages and current frequently occur successively. First a voltage is built up. When this voltage exceeds a particular level (depending on the steepness of the voltage rise), for example, a flash-over occurs and a current flow follows. Thus, the system to be investigated automatically switches from a voltage pulse to a current pulse.

These and other objects are achieved according to the present invention by providing an EMP generator having at least one spark gap with two approximately spherical poles, wherein the spark gap is arranged in a housing having an internal space which can be placed under excess pressure compared with its environment via a first opening and a first compressed-air line connected thereto; a folded bellows projects into the internal space of the housing and is closed off with respect to this internal space; one of the poles of the spark gap is attached to the folded bellows; the internal space of the folded bellows is connected to a second compressed-air line; and the internal space of the folded bellows is capable of being placed via the second compressed-air line under an excess pressure which deviates from the aforementioned excess pressure in the internal space of the housing but is approximately of the same magnitude.

SUMMARY OF THE INVENTION

Accordingly, one object of the present invention is to provide a new and improved EMP generator which can be used within the context of the previously explained measuring and testing concept and meets the requirements resulting from this concept.

Advantageous developments of the invention are characterized in the dependent claims.

BRIEF DESCRIPTION OF THE DRAWINGS

Further features and the advantages of the present invention are claimed from the subsequent detailed description of illustrative embodiments, particularly taking into consideration the attached drawings, in which:

DESCRIPTION OF THE PREFERRED EMBODIMENTS

Figure 1:
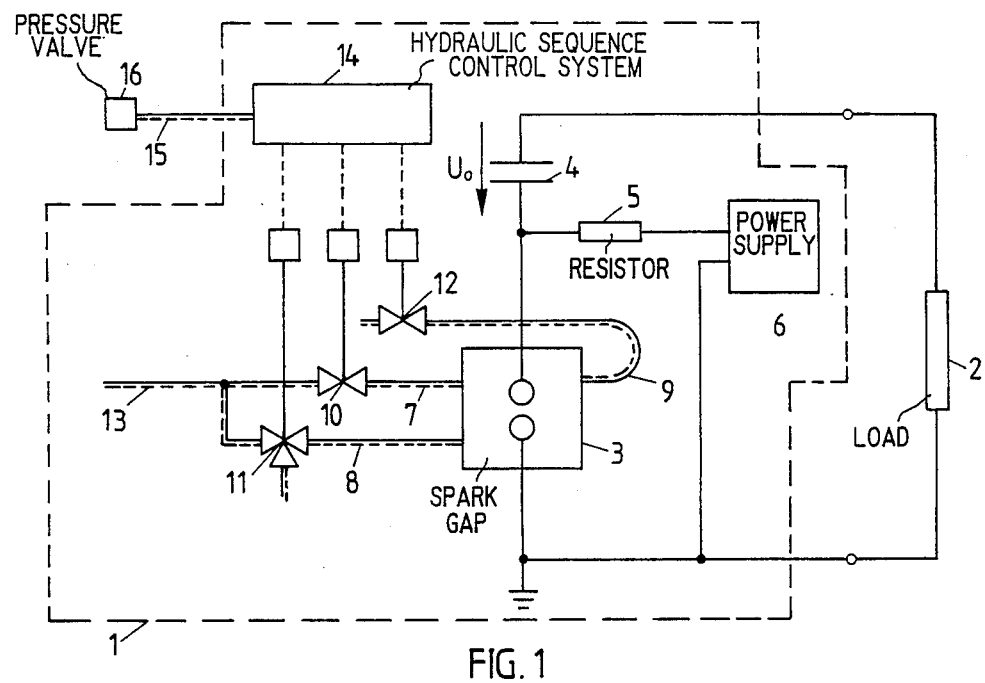
FIG. 1 shows a diagrammatic representation of an EMP generator with connected load and a pneumatically controllable spark gap.

Reference is now made to the drawings. FIG. 1 shows an EMP generator with connected load 2. The generator itself here simply consists of a series circuit of a spark gap 3 and a capacitor 4. The load 2 is connected to the terminals of this series circuit. When the spark gap 3 is nonconducting, the capacitor 4 can be charged up via a series resistor 5, connected between the spark gap 3 and itself to the series circuit, to a voltage Uo which is supplied by a power supply 6. The power supply 6 is of such a type that, in the case of a short circuit between its terminals, it supplies a short circuit current which is limited to a low value of a few mA. The spark gap 3 is a pneumatically triggerable spark gap. Is connected to three compressed-air lines 7, 8 and 9. The compressed air line 7 is connected via a controllable valve to a compressed-air line 13. The compressed-air line 8 is also connected to the compressed-air line 13 via a controllable valve 11. The valve 11 is constructed as a shuttle valve via which the compressed-air line 8 can be relieved to the outside. The compressed-air line 9 can be closed off from the environment by means of a controllable valve 12.

An hydraulic sequence control system 14 is provided for controlling the valves 10, 11 and 12. This control receives its starting signal via a hose line 15 to the end of which a manually closable pressure valve 16 is connected.

Figure 2:
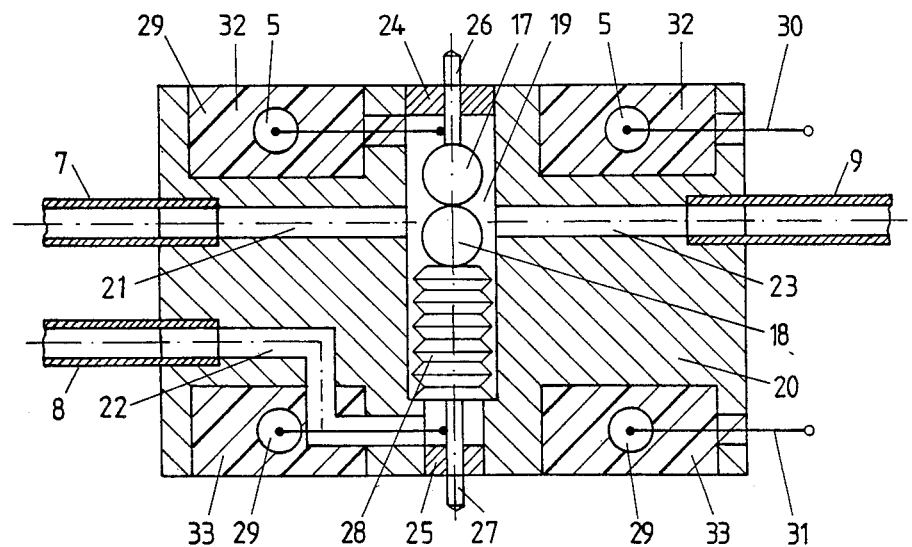
FIG. 2 shows a cutaway representation and detail of the spark gap according to FIG. 1.

The actual construction of the spark gap 3 according to the present invention can be seen in FIG. 2. According to this, the spark gap 3 exhibits two poles 17 and 18. These are arranged in the internal space 19 of a housing 20. The housing 20 consists of an electrically insulating material. It exhibits three openings 21, 22 and 23 to which the previously mentioned compressed-air lines 7, 8 and 9 are connected. The openings 21 and 23 are arranged opposite to one another and open into the internal space 19 of the housing 20 in the area between the two poles 17 and 18. The internal space 19 is closed off gas tight and pressure tight by two locking parts 24 and 25. The two poles 17 and 18 of the spark gap are connected through the locking parts 24 and 25 to first external connecting contacts 26 and 27. The pole 18 is mounted on a folded bellows 28, which can be elastically deformed with respect to its length and which is closed off air tight and pressure tight with respect to the internal space 19 of the housing 20. The interior of the folded bellows 28 is open towards the opening 22 and is connected via the latter to the compressed-air line 8.

The poles 17 and 18 of the spark gap are also connected via a chain of resistors 5 and 29 in each case due to external connecting contacts 30 and 31. The resistors 5 functionally correspond to the series resistance 5 of FIG. 1 and are therefore correspondingly designated. The significance of the resistors 29 will be further discussed below. The two resistor chains 5 and 29 are embedded firmly cast in a nonconducting material in recesses 32 and 33 of the housing 20. In FIG. 2, only two resistors in each case of the resistor chain 5 and 29 can be seen in section. The two chains in each case extend, for example, over half the circumference of the housing 20. The shape of the housing 20 and of its internal space 19 and as a result also the shape of the folded bellows 28 is cylindrical. The length of the housing 20 is approximately 6 cm, its diameter is 8 cm and that of the internal space 19 approximately 2 cm.

When the pressure in the internal space 19 of the housing 20 corresponds to that in the internal space of the folded bellows 28, the poles 17 and 18 of the spark gap are in direct contact with one another.

The spark gap described is used, for example in an arrangement according to FIG. 1, in the following manner:

A state is assumed in which the compressed air lines 8 and 9 are open to the outside via the valves 11 and 12 and the valve 10 is closed so that the compressed-air line 7 is not connected to the compressed-air line 13. In the internal space 19 of the housing 20 and in the interior of the folded bellows 28 environmental pressure then exists in correspondence. The two poles 17 and 18 are in direct contact with one another which represents a short circuit to the power supply. As explained, however, the power supply 6 only supplies a low short-circuit current.

To generate a pulse, the valve 12 is first closed and the valve 10 is opened. Via the compressed-air line 7, an excess pressure compared with the interior of the folded bellows 28 is then produced in the internal space 19 of the housing 20, as a result of which the bellows is compressed, that is to say shortened with respect to its length. As a result, the spark gap opens which eliminates the short-circuit situation and the capacitor 4 is charged. The extent of the opening of the spark gap, that is to say the mutual distance between the two poles depends on the pressure difference in the internal space 19 of the housing 20 and in the interior of the folded bellows 28. This pressure difference can be adjusted via valve 11 which is preferably a metering valve.

The breakdown of the spark gap and thus the generation of a pulse occurs when a certain critical ratio of the field strength between the poles 17 and 18 and the pressure in the internal space 19 of the housing is exceeded. The field strength between the poles 17 and 18 depends on the voltage applied between them, their mutual spacing and, especially with regard to their spatial distribution, on their shape. The aforementioned parameters also determine the speed of the breakdown and thus the rise time of the pulse generated.

According to the above, a breakdown of the spark gap can be provoked by an increase in the voltage with a fixed pole spacing and absolute pressure, by reducing the absolute pressure with fixed voltage and with fixed pole spacing or by reducing the pole spacing with fixed voltage and fixed absolute pressure.

The voltage of the power supply 6 is preferably preset, for example at 25 kV, and the breakdown of the spark gap is provoked by one of the last-mentioned methods. The absolute pressure between the poles 17 and 18 can be reduced, for example, by opening the valve 12. This will also slightly reduce the spacing between the poles 17 and 18.

If the valve 10 is still left open for a certain time after the opening of the valve 12 and the resultant flashover, the spark gap is advantageously blasted after its breakdown as a result of which the spark gap is better conditioned for a subsequent ignition. The openings 21 and 23 in the housing 20 are therefore arranged opposite to one another in the area of the spark gap, as already mentioned.

However, the flash-over is preferably provoked by reducing the spacing between the poles 17 and 18 by increasing the pressure in the compressed-air line 8 by means of the valve 11. But even in this case, the blasting of the spark gap is advantageously utilized.

As previously mentioned, the speed of the flash-over of the spark gap and thus the rise time of the pulse generated is determined by the value of the voltage between the poles 17 and 18, the absolute pressure in the internal space 19 of the housing 20 and by the pole spacing. The flash-over becomes faster and the rise time shorter the higher the voltage, the higher the absolute pressure and the shorter the pole spacing on ignition. For the absolute pressure, at least one value should be selected which is common in current compressed-air installations in buildings or plants, that is to say a pressure between $5.10^5$ and $10.10^5$ Pa. With predetermined voltage and predetermined absolute pressure, the ignition spacing becomes minimum if the shape of the poles 17 and 18 is constructed in such a manner that a constant field strength occurs on their surface at least on their sides facing one another. The shape actually required for this can be found in a thesis by Heiner Grönewald, Hamburg University 1982, having the title "Feldoptimierung von Hochspannungsbauteilen" [Field Optimization of highvoltage components], particularly page 139.

The sequence control system shown in FIG. 1 should be constructed in such a manner that it allows one of the aforementioned ignition and blasting mechanisms to be automatically controlled and only requires a pneumatic starting signal via the hose line 15.

The reason for giving preference to a pneumatic starting signal rather than to an electrical starting signal is that no electromagnetic interferences are transmitted or caused via the hose line 15, in contrast to an electrical cable.

In general, no electrical switching process is required for triggering a flash-over in the arrangement according to FIG. 1 and with a spark gap according to FIG. 2. All control steps are pneumatic. The charging process of the capacitor 4 only begins when the spark gap is pneumatically opened. As long as the spark gap is closed, the low short-circuit current flows. No voltage can build up. This is always the case as long as the internal space 19 of the housing 20 is not placed under excess pressure by suitable control of the valves 10 and 12 or if a pressure failure occurs. This significantly contributes to reducing the hazard to the person handling the generator.

The spark gap with its pneumatic control system, described above and constructed in accordance with the present invention, is advantageously suitable for also being integrated in a simple manner into other generator circuits.

Figure 3:
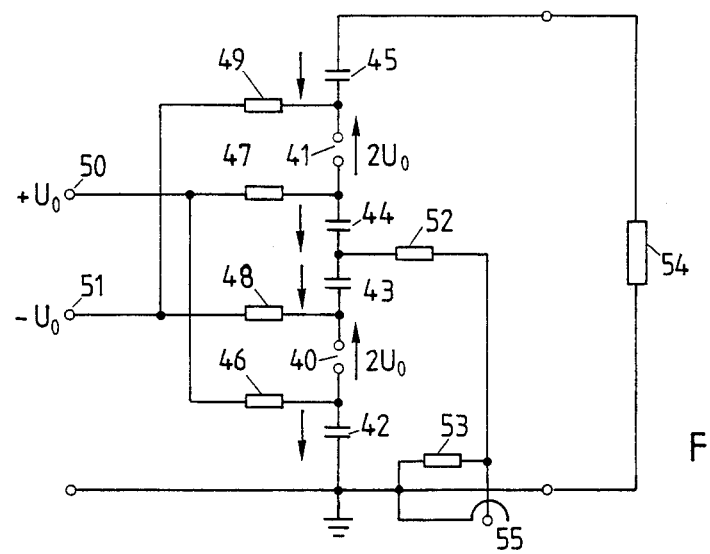
FIG. 3 shows a circuit diagram of a particularly advantageous generator circuit having two spark gaps.

A generator circuit according to the invention exhibiting several particularly advantageous characteristics is shown in FIG. 3. In this figure, two spark gaps 40 and 41 are connected in series with several capacitors 42–45. In the series circuit, starting from a connecting point connected to reference potential, for example ground potential, a first capacitor 42, a first spark gap 40, a second capacitor 43, a third capacitor 44, the second spark gap 41 and a fourth capacitor 45 are connected in series in the order mentioned. The series circuit is connected via several resistors 46–49 to a power supply of which only the terminals 50 and 51 are shown in FIG. 3. The potential at the terminals 50 and 51 is selected to be symmetric with respect to the reference potential at ±Uo, Uo being, for example, again 25 kV.

The positive terminal +Uo of the power supply is connected via the resistor 46 to a connecting point between the capacitor 42 and the spark gap 40 and via the resistor 47 to a connecting point between the capacitor 44 and the spark gap 41.

The negative terminal 51 of the power supply is connected via the resistor 48 to a connecting point between the spark gap 40 and the capacitor 43 and via the resistor 49 to a connecting point between the spark gap 41 and the capacitor 45.

A connecting point at the series circuit between the second capacitor 43 and the third capacitor 44 is connected via a resistor 52 and a resistor 53 to the reference potential.

The capacitance of all capacitors 42–45 is selected to be of equal magnitude. The value of the resistor 52 (and of the resistors 52 and 53 together) is selected to be of such a magnitude that the time constant determined by the capacitance of a capacitor and by this resistance value is much greater than the discharge time constant of the pulse circuit (capacitors 42–45, resistor 55, possibly load inductance) (which will be further discussed later). The said resistance value is, for example, 1 MΩ if a typical value of between 50Ω–100Ω is assumed for the resistor 54.

Finally, a load 54 is connected to the terminals of the series circuit of FIG. 3.

For the subsequent explanations of the operation of the circuit of FIG. 3, it is assumed that the spark gaps 40 and 41 are of the type represented in FIG. 2 and that a power supply with a limited short-circuit current is used. The resistors 46 and 48 and 47 and 49 in FIG. 3 are then formed by the resistors or resistor chains 5 and 29 embedded in the housing 20 of the spark gaps according to FIG. 2. Naturally, it is not necessary for the operation of the circuit of FIG. 3 to use spark gaps according to FIG. 2. Spark gaps of other construction can also be used. This correspondingly applies to the power supply.

Before the spark gaps 40 and 41 are put under pressure, they are closed. The power supply drives the short-circuit current via the two spark gaps.

To generate a pulse, the two spark gaps are pneumatically opened in the manner already described above. This results in the charging of the capacitors 42 to 45. Due to the selected circuit, only a voltage corresponding to the terminal voltage Uo of power supply with reference to the reference potential is in each case present at the individual capacitors 42–45. In each case, a voltage which is twice as large is set up across the spark gaps 40 and 41.

Figure 4:
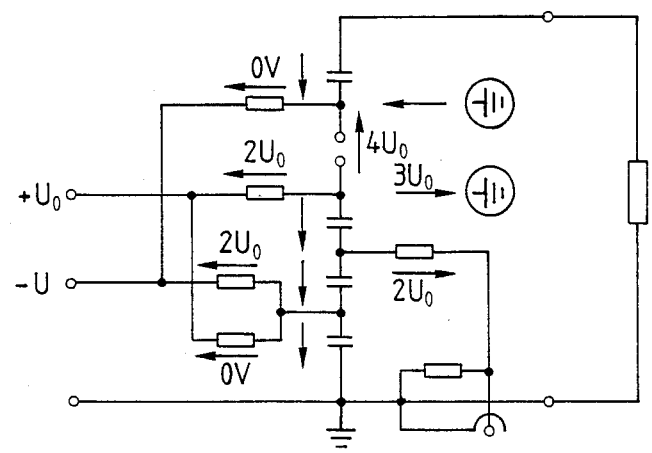
FIG. 4 shows a circuit diagram corresponding to the circuit diagram of FIG. 3 but in a transient state after breakdown of one of the spark gaps.

When the capacitors 42–45 are charged, the spark gap 40 is ignited in one of the manners described above. After ignition of the spark gap 40, the voltage across the second spark gap 41 steepens to four times the value of the terminal voltage Uo with reference to the reference potential. This transient state is represented in FIG. 4. FIG. 4 shows a circuit corresponding with FIG. 3 apart from the missing spark gap 40.

Figure 5:
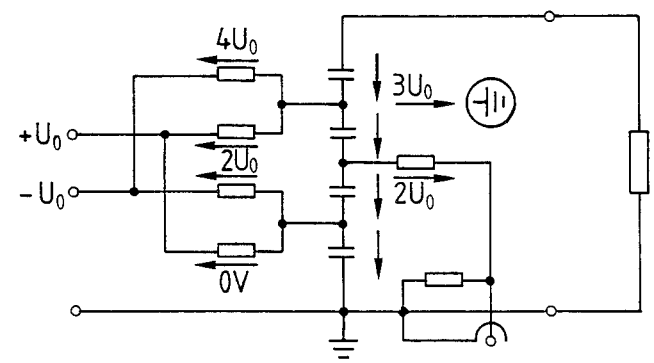
FIG. 5 shows a circuit diagram corresponding to the circuit diagram of FIG. 3 but in a state after breakdown of both spark gaps.

Due to the doubling voltage, the second spark gap 41 also breaks down which leads to a situation which is shown in FIG. 5. FIG. 5 corresponds to FIG. 4 except that the second spark gap 41 is also missing here. After the second spark gap 41 has also ignited, the capacitors discharge via the load 54.

In FIGS. 4 and 5, the reference symbols at the individual elements have been left off for reasons of clarity.

With respect to the fast progress from the ignition of the first spark gap 40 to the ignition of the second spark gap 41 (the time interval between the two ignitions is the ignition delay of the second spark gap), the series circuit via the resistors 46–49 and 52 and 53 must be decoupled from its charging circuit, that is to say particularly the power supply. The said resistors must be suitably dimensioned for this purpose. A suitable resistance value for the resistors 46–49 is, for example, 100 KΩ. A value of 1MΩ has already been mentioned for the resistor 52. In the case of a resistance value of 100 kΩ for resistors 46–49, however, it is assumed that these resistors do not need to be used at the same time as charging current limiting resistors but that the limiting of the charging current and of the short-circuit current is ensured by the power supply. The value of resistor 53 can be zero; if it is selected, for example, to be 1/1000 of the resistor 52, a voltage divider output for monitoring the pulse triggering is obtained at point 55.

The significant advantage of the generator circuit described according to FIG. 3 can be seen in the fact that voltage pulses can be generated which have a maximum value which corresponds to four times the terminal voltage of the required power supply compared with the reference potential. For generating a 100 kV voltage pulse, therefore, only a power supply delivery ±25 kV voltage is required. In contrast to 100 kV power supplies, such power supplies are small and handy, easily transportable, can be operated without great safety precautions and are, naturally, less expensive. In addition, the capacitors and resistors of the circuit only need to be designed for a continuous loading with the single terminal voltage Uo even though voltage values which are higher by up to four times occur across them. However, these only occur as surge loads, which is much less critical for the components. For this reason, small and inexpensive components can be used which, in turn, is of advantage with respect to a light-weight and compact construction of the generator. The surge loads occurring in detail across the resistors and capacitors can be seen in FIGS. 4 and 5. In these, as also in FIG. 3, the voltage arrows not especially designated are in each case intended to specify the terminal voltage Uo of the power supply with respect to the reference potential.

In the generator circuit according to FIG. 3 and to FIGS. 4 and 5, in each case a test point 55 is also provided. This is decoupled with respect to reference potential by the resistor 53. When the spark gap 40 ignites, a signal occurs at this test point which can be used as trigger signal for measuring electronics not shown in the figures. The extraction of such a signal is of importance because the spark gaps are pneumatically triggered and the accurate breakdown time cannot be predicted. In addition, a reference sensor for the electric field (56) is provided in the area of the output of the pulse generator which has an inherent rise time which is distinctly below one nanosecond.

The fact that only constructionally small components designed only for continuous loading of the magnitude of the terminal voltage Uo of the power supply with respect to the reference potential need to be used in the generator circuit according to FIG. 3 is of special significance for implementing a very fast pulse generator with, at the same time, very high power, because the constructional size already plays a considerable role with respect to the propagation time effects and the inductance of however short line connections in the range of pulse rise times in the range of approximately one nanosecond.

The above fact that small compact components, particularly compact capacitors, can be used in the generator circuit according to FIG. 3 allows, in conjunction with spark gaps as represented in FIG. 2, implementation of a generator which generates a 100 kV pulse with a rise time of only 1.5 nanoseconds.

Figure 6:
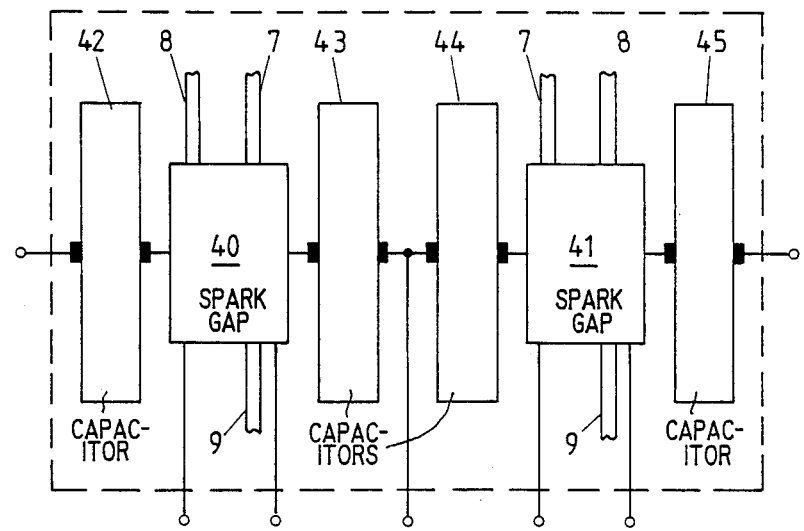
FIG. 6 shows a diagrammatic representation of an advantageous spatial arrangement of the spark gaps and capacitors of the circuit of FIG. 3 for implementing a fast high-power pulse generator.

Such a generator is diagrammatically shown in FIG. 6. 40 and 41 designate spark gaps of the type of FIG. 2. 42–45 designate disk capacitors. The said elements form a constructional unit and should be plugged directly onto one another. For this purpose, it is naturally necessary that the disk capacitors and the spark gaps are provided with appropriate plug-in connecting contacts fitting one another. When in the context of the plug-in concept, the disk capacitors can also be advantageously replaced by other disk capacitors having a different capacitance. This makes it possible to adapt the generator according to FIG. 6 easily to the load 54 and the desired curve shape of the pulse to be generated.

Figure 7:
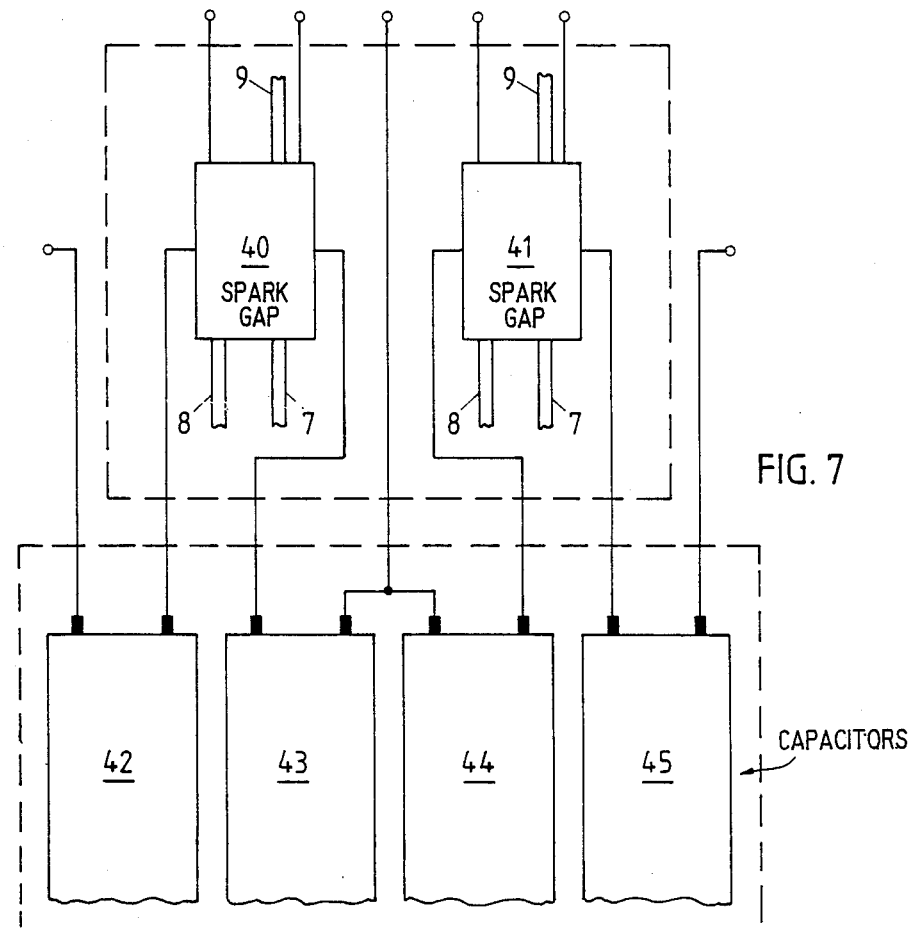
FIG. 7 shows a diagrammatic representation of an advantageous spatial arrangement of the spark gaps, on the one hand, and capacitors of the circuit of FIG. 3 for implementing a particularly efficient generator having large capacitances, on the other hand.

If the capacitance which can be achieved by means of disk capacitors is not sufficient for a particular application and thus, for example, larger block capacitors must be used, an arrangement shown in FIG. 7 can be chosen.

In this case, the two spark gaps 40 and 41 form a constructional unit separate from the capacitors 42-45. The capacitors 42-45 are preferably also combined to form a constructional unit onto which, for example, the constructional unit with the spark gaps 40, 41 can be plugged. An adaptation to the respective load is then in each case again possible in a simple manner by exchanging the capacitor unit. However, as a rule, the arrangement according to FIG. 7 cannot be used for generating pulses which are as fast as can be generated by means of the arrangement according to FIG. 6.

In all the above generator embodiments, the power supply forms a separate constructional unit. It must therefore be connected via cables to the connecting contacts at the spark gaps. A commercially available device can be used for the power supply.

Overall, an entire modular generator concept is specified by the invention. Generators meeting the requirements given by the respective application can be constructed from the spark gaps, the associated pneumatics and the power supply as fixed basic modules, particularly in the context of the circuit according to the invention according to FIG. 3 having different capacitors.

It must also be mentioned at this point that, in addition to the circuit elements shown in FIGS. 3 to 7, inductance can also be necessary for generating a required pulse shape, particularly for generating oscillating pulses. The required inductances can be connected in series with the capacitors in each case.

Finally, the initially demanded characteristic of the generator, to apply first a voltage and then a current pulse to a load in order to be able to simulate, for example, flash-overs in systems to be checked, will also be discussed. By using spark gaps according to the invention, the conditions of switching from a voltage to a current pulse can be changed in a simple and controlled manner, by selecting the absolute pressure and, particularly in the case of a generator having two spark gaps, by presetting the spacing between the poles of the spark gap igniting later.

Additional mention is only made of the fact that, naturally, a generator having more than two spark gaps could also be built up by correspondingly extending the circuit according to FIG. 3.

What is claimed as new and desired to be secured by Letters Patent of the United States is:

1. EMP generator comprising:
   at least one spark gap with two approximately spherical poles;
   a housing in which the spark gap is arranged;
   the housing having an internal space (19) which can be placed under excess pressure compared with its environment via a first opening (21) and a first compressed-air line (7) connected thereto;
   a folded bellows (28) projecting into the internal space (19) of the housing (20), wherein said folded bellows is closed off with respect to said internal space (19);
   one of the poles (18) of the spark gap attached to said folded bellows (28);
   the internal space of the folded bellows (28) can be placed via the second compressed-air line (8) under an excess pressure which deviates from the aforementioned excess pressure in the internal space of the housing (20) but is approximately of the same magnitude.

2. EMP generator as claimed in claim 1, furthermore comprising at least one or several of the following features:
   the internal space (19) of the housing (29) and of the folded bellows (28) can be placed under an excess pressure of up to $8 \cdot 10^5$ Pa;
   the housing (20) comprises a further second opening (23) to which a third compressed-air line (9) is connected;
   the first opening (21) and the second opening (23) of the housing (20) are arranged opposite to one another in the area of the two poles (17, 18) of the spark gap;
   the housing (20), its internal space (19) and the folded bellows (28) have a cylindrical shape;
   when the pressure in the internal space of the housing (20) corresponds to that in the internal space of the folded bellows (28), the spark gap is closed with the poles (17, 18) in direct contact with one another;
   when the pressure in the internal space (19) of the housing (20) is higher than in the internal space of the folded bellows (28), the length of the folded bellows (20) is shortened, compared with the aforementioned state when the pressure is in correspondence, and the spark gap is open with the poles (17, 18) not in direct contact with one another;
   the form of the shape of the poles (17, 18) deviates from the spherical shape on the sides of the poles (17, 18) facing one another and said sides facing one another are shaped such that an electrical field strength which is constant occurs on the said sides when a voltage is applied between said poles (17, 18);
   the poles (17, 18) are in each case electrically connected to the first and second connecting contacts (26, 27) on the outsides of the housing (20);
   at least one ohmic resistance (5, 29) is in each case arranged in the connecting line of the poles (17, 18) to the second connecting contacts (30, 31);
   the resistances (5, 29) are embedded in the material of the housing (20);
   the first connecting contacts (26, 27) are arranged on opposite sides of the housing (20);
   the first connecting contacts (26, 27) are arranged on a common axis with that of the folded bellows (28) and of the spark gap;
   the material of the housing is an electric insulating material;
   the diameter of the poles (17,18) is about 8 mm, the maximum spacing of the poles (17, 18) can be adjusted to 20 mm, all other dimensions are kept as small as possible for reasons of rigidity.

3. EMP generator as claimed in one of claims 1 or 2, furthermore comprising the following features:
   at least two of the compressed-air limes (7, 8) are connected via controllable valves (10, 11) to a common compressed-air line (13);
   an hydraulic sequence control system is provided for controlling the valves (10, 11, 12);
   the sequence control system (14) receives its starting signal via a hose line (25) at the free end of which a manually operable pressure generator is provided.

4. EMP generator comprising:
   a series circuit of at least two spark gaps (40, 41) connected in series with plural capacitors (42-45)

and a power supply connected to the said series circuit via several resistors (46-40);

said series circuit, starting from a connecting point connected to a reference potential, including at least one capacitor (42), a first spark gap (40), a second capacitor (43), a third capacitor (44), a second spark gap (41) and a fourth capacitor (45) connected in series in the above order;

the potential value of the reference potential is symmetrically selected between the potential values of the two terminals of the power supply;

a connecting point between the first capacitor (42) and the first spark gap (40) is connected via a first resistor (46) to one of the terminals of the power supply;

a connecting point between the first spark gap (40) and the second capacitor (43) is connected via a second resistor (48) to the other one of the terminals of the power supply;

a connecting point between the second (43) and the third capacitor (44) is connected to the reference potential via a decoupling resistor (52, 53);

a connecting point between the third capacitor (44) and the second spark gap (41) is connected via a third resistor (47) to the first-mentioned terminal of the power supply;

a connecting point between the second spark gap (41) and the fourth capacitor (45) is connected via a fourth resistor (49) to the second-mentioned terminal of the power supply.

5. EMP generator as claimed in claim 4, furthermore comprising one or several of the following features:

the voltage of the terminals of he power supply is selected as ±25 kV or −25 kV relative to the reference potential;

the capacitances of all capacitors (42-45) are of equal magnitude;

the time constant determined by the capacitance of a capacitor (42, 43, 44, 46) and the value of the decoupling resistor (52, 53) of preferably 1 MΩ is much greater than the discharge time constant of the entire pulse circuit;

the resistors (46-49) are formed by a series connection of several individual resistors;

the resistance value of the resistors (46, 49) is approximately 100 kΩ;

the power supply supplies in the case of a short circuit between its terminals a short-circuit current regulated to a low value of preferably only a few mA.

6. EMP generator as claimed in claims 4 or 5, furthermore comprising the following feature:

spark gaps of the type characterized in claims 1 and 2 are used for the spark gaps (40, 41).

7. EMP generator as claimed in claim 4, furthermore comprising one or several of the following features:

disk capacitors with connecting terminals on their opposite side faces are used for the capacitors (42-45);

the capacitors are arranged spatially on one axis with the spark gaps (40, 41);

the mutual spacing of the said elements (40-45) on the axis is selected to be as small as is permitted by their constructional shapes;

in particular, the spark gaps and capacitors (40-45) are provided with connecting terminals which are constructed in such a manner that they can be plugged directly onto one another;

the spark gaps (40, 41) are combined with the capacitors (42-45) in one spatial constructional unit.

8. EMP generator as claimed in claim 4, furthermore comprising one or several of the following features:

the spark gaps (40, 41) are combined to form one spatial constructional unit separated from the capacitors (42-45);

the capacitors (42-45) are also combined to form a separate spatial constructional unit;

the two constructional units are provided with connecting contacts constructed in such a manner that they can be plugged onto one another.

9. EMP generator as claimed in claim 4, furthermore comprising one or several of the following features:

the power supply is constructed as an independent device spatially separated from the spark gaps (40, 41) and the capacitors (42-45);

the terminals of the power supply are connected via cables to the second connecting contacts (30, 31) at the spark gaps.

* * * * *